United States Patent
Park

(10) Patent No.: US 9,472,300 B2
(45) Date of Patent: Oct. 18, 2016

(54) DATA STORAGE DEVICE AND OPERATING METHOD THEREOF

(71) Applicant: SK hynix Inc., Gyeonggi-do (KR)

(72) Inventor: Jong Won Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 14/562,375

(22) Filed: Dec. 5, 2014

(65) Prior Publication Data

US 2016/0027524 A1    Jan. 28, 2016

(30) Foreign Application Priority Data

Jul. 23, 2014   (KR) .................. 10-2014-0093273

(51) Int. Cl.
| | |
|---|---|
| *G11C 16/26* | (2006.01) |
| *G11C 16/34* | (2006.01) |
| *G11C 11/56* | (2006.01) |
| *G11C 29/42* | (2006.01) |
| *G11C 29/52* | (2006.01) |

(52) U.S. Cl.
CPC ....... *G11C 16/3445* (2013.01); *G11C 11/5642* (2013.01); *G11C 16/26* (2013.01); *G11C 29/42* (2013.01); *G11C 29/52* (2013.01)

(58) Field of Classification Search
CPC .............. G11C 16/3445; G11C 16/26; G11C 16/3404; G11C 16/34; G11C 11/5642
See application file for complete search history.

(56) References Cited

U.S. PATENT DOCUMENTS

| | | | | |
|---|---|---|---|---|
| 7,849,383 | B2* | 12/2010 | Lin ...................... | G06F 11/1072 365/220 |
| 2009/0003058 | A1* | 1/2009 | Kang .................. | G11C 11/5642 365/185.03 |
| 2009/0049364 | A1* | 2/2009 | Jo ........................ | G06F 11/1072 714/763 |
| 2013/0070526 | A1* | 3/2013 | Eun ........................ | G11C 16/26 365/185.03 |
| 2013/0107633 | A1* | 5/2013 | Kim .................... | G11C 11/5642 365/185.18 |
| 2013/0194883 | A1* | 8/2013 | Lee ........................ | G11C 29/04 365/201 |
| 2014/0056068 | A1* | 2/2014 | Strasser .............. | G06F 11/1048 365/185.03 |
| 2014/0129902 | A1* | 5/2014 | Yoon ................... | G11C 11/5642 714/764 |
| 2014/0153330 | A1* | 6/2014 | Yoon ................... | G11C 11/5642 365/185.03 |
| 2014/0281770 | A1* | 9/2014 | Kim .................... | G06F 11/1068 714/721 |

FOREIGN PATENT DOCUMENTS

KR    1020140020056    2/2014

* cited by examiner

*Primary Examiner* — Douglas King
(74) *Attorney, Agent, or Firm* — IP & T Group LLP

(57) ABSTRACT

An operating method of a data storage device includes performing a first static read fail solving operation in which the memory cell is read by applying read fail solving voltages included in a first group to the memory cell; and performing a second static read fail solving operation in which the memory cell is read by applying read fail solving voltages included in a second group to the memory cell after the first static read fail solving operation fails, wherein read success numbers of the respective read fail solving voltages included in the first group are larger than read success numbers of the respective read fail solving voltages included in the second group.

20 Claims, 12 Drawing Sheets

Read Fail Solving Voltage Table(SLC)

| Original read voltage | Solving Voltage | Read Success Number | Group |
|---|---|---|---|
| Vrd | Vsv_9 | 39 | G1 |
| | Vsv_1 | 35 | |
| | Vsv_3 | 33 | |
| | Vsv_8 | 31 | |
| | Swap Vsv_2 | 27 | |
| | Vsv_5 | 26→28 | G2 |
| | Vsv_7 | 25 | |
| | Vsv_4 | 22 | |
| | Vsv_6 | 20 | |
| | Vsv_10 | 19 | |

FIG.5

Read Fail Solving Voltage Table(SLC)

| Original read voltage | Solving Voltage | Read Success Number | Group |
|---|---|---|---|
| Vrd | Vsv_9 | 39 | G1 |
| | Vsv_1 | 35 | |
| | Vsv_3 | 33 | |
| | Vsv_8 | 31 | |
| | Swap Vsv_2 | 27 | |
| | Vsv_5 | 26→28 | G2 |
| | Vsv_7 | 25 | |
| | Vsv_4 | 22 | |
| | Vsv_6 | 20 | |
| | Vsv_10 | 19 | |

FIG.6

Read Fail Solving Voltage Table(2bit MLC)

| Original Read Voltage | Solving Voltage | Read Success Number | Original Read Voltage | Solving Voltage | Read Success Number | Set | Group |
|---|---|---|---|---|---|---|---|
| Vrd_P2 (LSB read voltage) | Vsv_P2_8 | 39 | Vrd_P1 Vrd_P3 (MSB read voltage) | Vsv_P1_7 / Vsv_P3_7 | 50 | S1 | G1 |
| | Vsv_P2_6 | 35 | | Vsv_P1_5 / Vsv_P3_5 | 44 | S2 | |
| | Vsv_P2_3 | 33 | | Vsv_P1_2 / Vsv_P3_2 | 43 | S3 | |
| | Vsv_P2_2 | 31 | | Vsv_P1_3 / Vsv_P3_3 | 38 | S4 | |
| | Vsv_P2_10 | 27 | | Vsv_P1_8 / Vsv_P3_8 | 35 | S5 | |
| | Vsv_P2_5 | 26 | | Vsv_P1_1 / Vsv_P3_1 | 33 | S6 | G2 |
| | Vsv_P2_1 | 25 | | Vsv_P1_6 / Vsv_P3_6 | 30 | S7 | |
| | Vsv_P2_7 | 22 | | Vsv_P1_4 / Vsv_P3_4 | 29 | S8 | |
| | Vsv_P2_9 | 20 | | Vsv_P1_10 / Vsv_P3_10 | 28 | S9 | |
| | Vsv_P2_4 | 19 | | Vsv_P1_9 / Vsv_P3_9 | 25 | S10 | |

DATA STORAGE DEVICE AND OPERATING METHOD THEREOF

CROSS-REFERENCES TO RELATED APPLICATION

The present application claims priority under 35 U.S.C. §119(a) to Korean application number 10-2014-0093273, filed on Jul. 23, 2014, in the Korean Intellectual Property Office, which is incorporated herein by reference in its entirety.

BACKGROUND

1. Technical Field

Various embodiments relate to a data storage device, and more particularly, to a data storage device and an operating method thereof.

2. Related Art

Recently, the computing environment paradigm has converted to ubiquitous computing so that computer systems can be used anytime and anywhere. Due to this fact, the use of portable electronic devices such as mobile phones, digital cameras, and notebook computers has rapidly increased. In general, such portable electronic devices use a data storage device having a memory device. The data storage device is used as a main memory device or an auxiliary memory device of the portable electronic devices.

A data storage device using a memory device provides advantages of excellent stability and durability, fast information access, and low power consumption because it has no moving parts. Data storage devices having such advantages include a universal serial bus (USB) memory device, a memory card having various interfaces, a universal flash storage (UFS) device, and a solid state drive (SSD).

The data stored in the memory cells of a memory device may be corrupted due to interference between memory cells, disturbance between memory cells, and wear of memory cells caused by repeated erase/program operations. When data stored in a memory cell is corrupted, the data stored in the memory cell has an error, which causes the read operations of a data storage device to fail. Data storage devices use various methods for solving failures of read operations.

SUMMARY

Various embodiments are directed to a data storage device and an operating method thereof, which may decrease the error occurrence rate of data read from a memory device and thereby decrease the amount of read operation failures.

In an embodiment, an operating method of a data storage device may include: performing a first static read fail solving operation in which the memory cell is read by applying read fail solving voltages included in a first group to the memory cell; and performing a second static read fail solving operation in which the memory cell is read by applying read fail solving voltages included in a second group to the memory cell after the first static read fail solving operation fails, wherein read success numbers of the respective read fail solving voltages included in the first group are larger than read success numbers of the respective read fail solving voltages included in the second group.

In an embodiment, an operating method of a data storage device may include: performing a first static read fail solving operation using read fail solving voltages included in a first group; performing a dynamic read fail solving operation using read fail solving voltages dynamically selected within a solving voltage range; and performing a second read fail solving operation using read fail solving voltages included in a second group after the first static read fail solving operation fails, wherein read success numbers of the respective read fail solving voltages included in the first group are larger than read success numbers of the respective read fail solving voltages included in the second group.

In an embodiment, a data storage device may include: a nonvolatile memory device; and a controller suitable for performing a first static read fail solving operation using read fail solving voltages included in a first group, and performing a second static read fail solving operation using read fail solving voltages included in a second group after the first static read fail solving operation fails, wherein read success numbers of the respective read fail solving voltages included in the first group are larger than read success numbers of the respective read fail solving voltages included in the second group.

According to the embodiments, the number of failures of data storage device read operations may be decreased, and thereby, the reliability of data may be improved.

BRIEF DESCRIPTION OF THE DRAWINGS

FIGS. 5 and 6 are diagrams illustrating read fail solving voltage tables in accordance with an embodiment.

DETAILED DESCRIPTION

Figure 1:
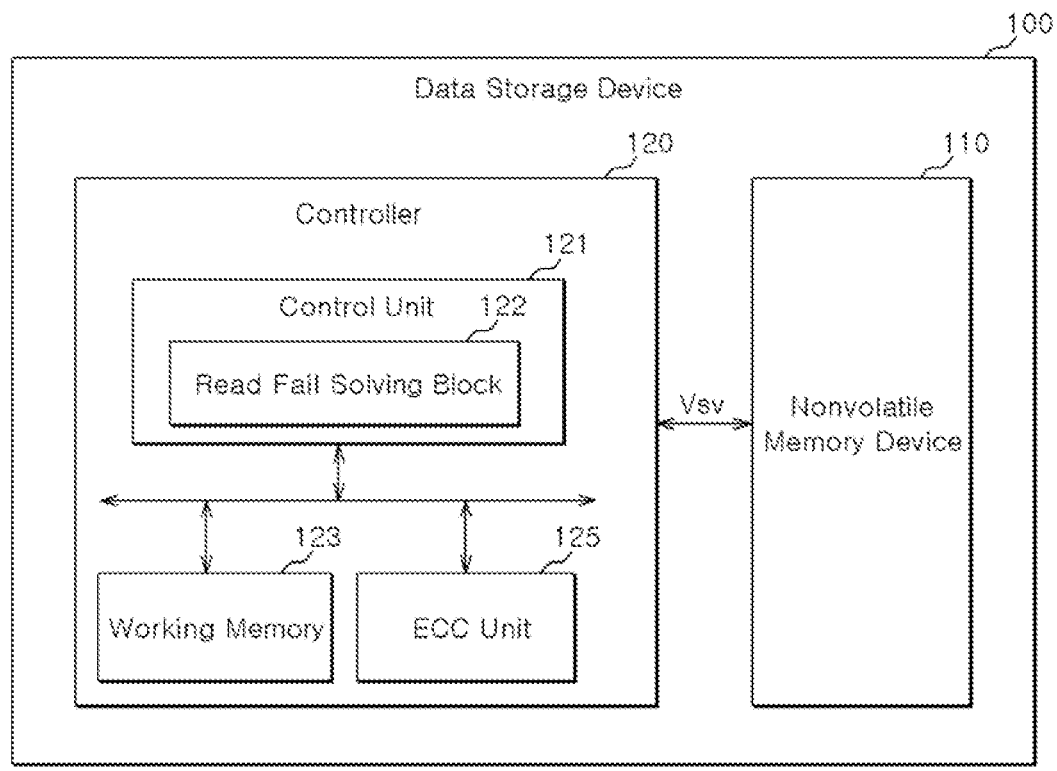
FIG. 1 is a block diagram illustrating a data storage device in accordance with an embodiment.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood that embodiments of the present invention are not limited to the particulars shown in the drawings and the drawings are not necessarily to scale and in some instances proportions may have been exaggerated in order to more clearly depict certain features of the invention. While particular terminology is used, it is to be appreciated that the terminology used is for the purpose of describing particular embodiments only and is not intended to limit the scope of the present invention.

The term "and/or" includes any and all combinations of one or more of the associated listed items. It will be understood that when an element is referred to as being "on," "connected to" or "coupled to" another element, it may be directly on, connected or coupled to the other element or intervening elements may be present. Additionally, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

FIG. 1 is a block diagram illustrating a data storage device in accordance with an embodiment. A data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various kinds of storage devices according to the protocol of an interface which is electrically coupled with the host device. For example, the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one of various kinds of package types. For example, the data storage device 100 may be manufactured as any one of various kinds of package types such as a package-on-package (POP), a system-in-package (SIP), a system-on-chip (SOC) a multi-chip package (MCP), a chip-on-board (COB), a wafer-level fabricated package (WFP) and a wafer-level stack package (WSP).

The data storage device 100 may include a nonvolatile memory device 110. The nonvolatile memory device 110 may operate as the storage medium of the data storage device 100. The nonvolatile memory device 110 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal oxide. The nonvolatile memory device 110 may be configured by a combination of a NAND flash memory devices and one or more of the various types of nonvolatile memory devices described above.

The data storage device 100 may include a controller 120. The controller 120 may include a control unit 121, a working memory 123, and an error correction code (ECC) unit 125.

The control unit 121 may control the general operations of the controller 120. The control unit 121 may analyze and process a signal which is inputted from a host device. To this end, the control unit 121 may decode and drive the firmware or the software loaded on the working memory 123. The control unit 121 may be realized by hardware a combination of hardware and software.

The control unit 121 may include a read fail solving block 122 for processing read operation failures (hereinafter, referred to as a read fail) for the nonvolatile memory device 110 when the read operation fails. The read fail solving block 122 may be realized by hardware, firmware, or software which may be decoded and processed by the control unit 121.

The working memory 123 may store the firmware or the software which is driven by the control unit 121, and data necessary for the driving thereof. The working memory 123 may temporarily store data to be transmitted from the host device to the nonvolatile memory device 110 or from the nonvolatile memory device 110 to the host device.

The ECC unit 125 may perform an error detecting operation for detecting whether an error is included in the data read from the nonvolatile memory device 110 and an error correcting operation for correcting the error included in the data. To this end, the ECC unit 125 may generate error correction codes for data to be stored in the nonvolatile memory device 110. The ECC unit 125 may detect an error in data read from the nonvolatile memory device 110, based on the error correction codes.

The ECC unit 125 may correct the detected error when the detected error is within its error correction capability. Where the detected error is corrected (that is, the ECC succeeds), the read fail of the data storage device 100 does not occur. In other words, when the detected error is corrected, the reading of the data storage device 100 succeeds. The ECC unit 125 may not correct the detected error when the detected error is out of the error correction capability. Where the detected error cannot be corrected (that is, the ECC fails), the read fail of the data storage device 100 may occur.

The read fail solving block 122 of the control unit 121 may perform a read fail solving operation for solving a read fail. The read fail solving operation may include one or more read operations for the nonvolatile memory device 110. The read operation performed during the read fail solving operation may be distinguished from a read operation performed according to a read request from the host device. Namely, the read operation performed during the read fail solving operation is an additional read operation which tries fix read failures that occur when read operations performed after read requests from the host device fail.

The read fail solving block 122 may repeatedly perform the read operation to the nonvolatile memory device 110 until the error included in the data read from the nonvolatile memory device 110 becomes correctable. The read fail solving block 122 may control the read operation in such a manner that a read operation is performed again with a read voltage different from the read voltage used during a previous read operation. The read fail solving block 122 may provide a read fail solving voltage (hereinafter, referred to as a solving voltage) Vsv to the nonvolatile memory device 110 each time the read operation is performed.

The read fail solving operation performed according to the control of the read fail solving block 122 may include a static read fail solving operation and a dynamic read fail solving operation. These read fail solving operations will be described below in detail.

Figure 2:
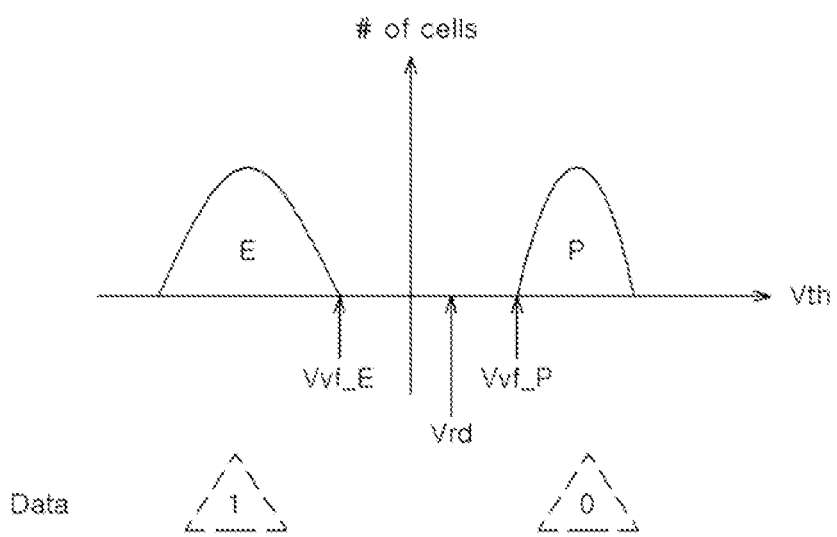
FIGS. 2 and 3 are diagrams illustrating threshold voltage distributions of the memory cells of a nonvolatile memory device shown in FIG. 1.
Figure 3:
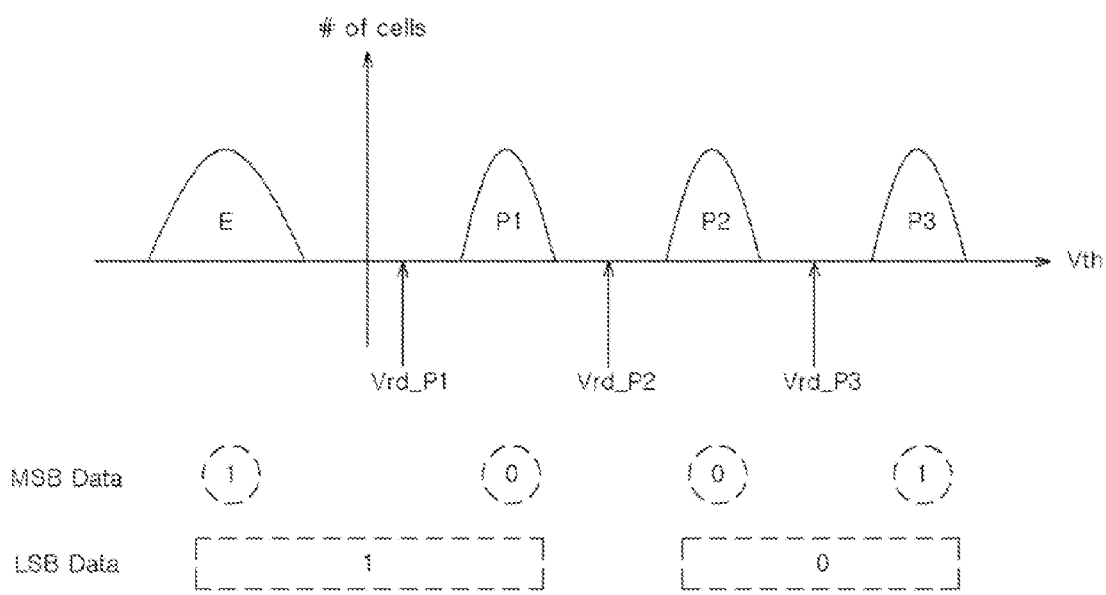

FIGS. 2 and 3 are diagrams illustrating threshold voltage distributions of the memory cells of the nonvolatile memory device 110 shown in FIG. 1. Each of the memory cells of the nonvolatile memory device 110 may store single bit data (that is, 1-bit data). Such a memory cell is referred to as a single level cell (SLC). In another example, each of the memory cells may store plural bit data (that is, 2 or more-bit data). Such a memory cell is referred to as a multi-level cell (MLC).

As shown in FIG. 2, a single level cell (SLC) may be erased or programmed to have a threshold voltage corresponding to any one of an erase state E and a program state P according to single bit data. In a read operation, a read voltage Vrd which has a voltage level between the erase state E and the program state P may be applied to a memory cell. If the read voltage Vrd is applied, a memory cell with the threshold voltage of the erase state E may be determined to store data "1", and a memory cell with the threshold voltage of the program state P may be configured to store data "0".

A multi-level cell (MLC), which stores 2-bit data, is shown in FIG. 3. Two(2)-bit multi-level cells may be erased or programmed to have a threshold voltage corresponding to any one of an erase state E and a plurality of program states P1, P2 and P3 according to multi-bit data, that is, LSB (least significant bit) data and MSB (most significant bit) data. In a read operation, any one of a first read voltage Vrd_P1 between the erase state E and the first program state P1, a second read voltage Vrd_P2 between the first program state P1 and the second program state P2, and a third read voltage Vrd_P3 between the second program state P2 and the third program state P3 may be applied to a memory cell.

If the second read voltage Vrd_P2 is applied, a memory cell with the threshold voltage of the erase state E and the first program state P1 may be determined to store LSB data "1" and a memory cell with the threshold voltage of the second program state P2 and the third program state P3 may be determined to store LSB data "0". If the first read voltage Vrd_P1 is applied, a memory cell with the threshold voltage of the erase state E may be determined to store MSB data "1", and a memory cell with the threshold voltage of the first program state P1 may be determined to store MSB data "0". If the third read voltage Vrd_P3 is applied, a memory cell with the threshold voltage of the second program state P2 may be determined to store MSB data "0", and a memory cell with the threshold voltage of the third program state P3 may be determined to store MSB data "1".

Although FIG. 3 exemplarily shows the second read voltage Vrd_P2 as a voltage for reading LSB data, and the first read voltage Vrd_P1 and the third read voltage Vrd_P3 as voltages for reading MSB data a voltage for reading LSB data and voltages for reading MSB data may vary according to the erase state E and the program states P1, P2 and P3.

Figure 4:
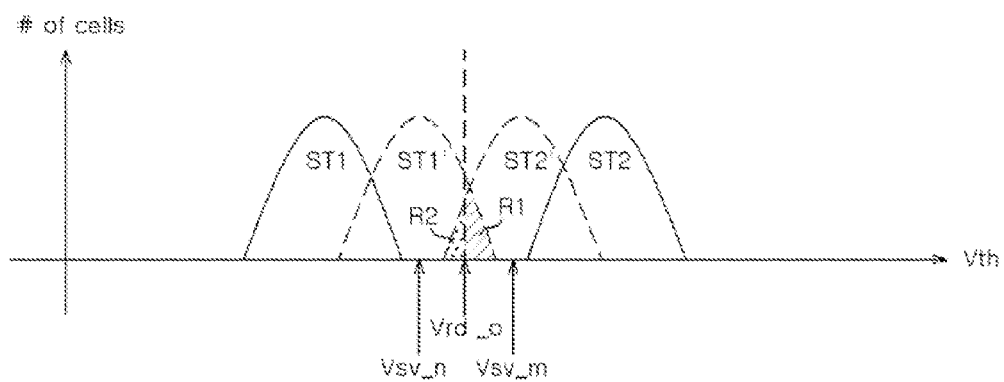
FIG. 4 is a diagram illustrating an operating method of a data storage device in accordance with an embodiment.

FIG. 4 is diagram illustrating an operating method of a data storage device in accordance with an embodiment, which is performed for the memory cells stored with data including errors. In describing FIG. 4, it is assumed that a threshold voltage distribution ST1 lower than an original read voltage Vrd_o, and a threshold voltage distribution ST2 higher than the original read voltage Vrd_o are in normal states.

According to such an assumption, a threshold voltage distribution ST1' and a threshold voltage distribution ST2' which are shown by dotted lines represent abnormal states, and the data stored in memory cells belonging to these threshold voltage distributions ST1' and ST2' may include errors, For example, when the original read voltage Vrd_o is applied, memory cells, the threshold voltages of which are positioned in a region R1 of the threshold voltage distribution ST1', may be determined as belonging to the threshold voltage distribution ST2. In this case, the memory cells of the region R1 may be determined to store data different from original data, that is, data including errors. For another example, when the original read voltage Vrd_o is applied, memory cells, the threshold voltages of which are positioned in a region R2 of the threshold voltage distribution ST2', may be determined as belonging to the threshold voltage distribution ST1. That is to say, the memory cells of the region R2 may be determined to store data different from original data, that is, data including errors.

If a resolving voltage Vsv_m different from the original read voltage Vrd_o is applied by the read fail solving operation, the memory cells the region R1 may be determined as belonging to the threshold voltage distribution ST1. Accordingly, even though the threshold voltages are positioned in the region R1, the memory cells in the region R1 may be determined to store the original data. If a resolving voltage Vsv_n different from the original read voltage Vrd_o is applied by the read fail solving operation, the memory cells in the region R2 may be determined as belonging to the threshold voltage distribution ST2. Accordingly, even though the threshold voltages are positioned in the region R2, the memory cells in the region R2 may be determined to store the original data.

As described above, when the read fail solving operation is performed, a read operation may be performed again according to a read voltage different from the read voltage used in a previous read operation. Where the read fail solving operation is initially performed, since the previous read operation was a read operation according to a read request from the host device, the read voltage used during the previous read operation may mean the original read voltage Vrd_o, and the read voltage different from the read voltage used in the previous read operation may be the solving voltage Vsv_m or Vsv_n. Where the read fail solving operation is previously performed, since the previous read operation was a read operation performed during the read fail solving operation, the read voltage used in the previous read operation may be the solving voltage Vsv_m or Vsv_n, and the read voltage different from the read voltage used in the previous read operation may be another solving voltage Vsv_m or Vsv_n different from the previous solving voltage Vsv_m or Vsv_n.

While the read fail solving operation is performed, because a read operation should be repeatedly performed by changing the solving voltage until the error included in read data becomes correctable, various solving voltages may be used. The static read fail solving operation and the dynamic read fail solving operation may be defined by selecting the solving voltage to be used. Where the static read fail solving operation is performed, a solving voltage may be selected based on a read fail solving voltage table. Where the dynamic read fail solving operation is performed, a solving voltage may be dynamically selected within a solving voltage range.

FIGS. 5 and 6 are diagrams illustrating read fail solving voltage tables in accordance with an embodiment. FIG. 5 shows the read fail solving voltage table which is referred to in a single level cell (SLC). FIG. 6 shows a read fail solving voltage table which is referred to a 2-bit multi-level cell (MLC). Although FIGS. 5 and 6 exemplarily show the read fail solving voltage tables, each of which is configured by 10 solving voltages, the number of solving voltages of the read fail solving voltage tables may vary according to design.

The read fail solving voltage tables may be generated and managed by the read fail solving block 122. While the data storage device 100 operates, the read fail solving voltage tables may be loaded on the working memory 123 and may be referred to by the read fail solving block 122.

Referring to FIG. 5, the read fall solving voltage table, which is referred to in the case of a single level cell (SLC), may have a plurality of solving voltages $Vsv\_1$ to $Vsv\_10$ grouped into two or more groups G1 and G2. For example, each of the plurality of solving voltages $Vsv\_1$ to $Vsv\_10$ may belong to one of a first group G1 or a second group G2 according to its read success numbers. The first group G1 may include the solving voltages, the read success numbers which are relatively large, and the second group G2 may include the solving voltages, the read success numbers, which are relatively small. The "read success number" is the number of successful read operations performed during the read fail solving operation with a corresponding solving voltage. Such read success numbers may be accumulated each time the read operation is performed during the read fail solving operation.

Because the solving voltages $Vsv\_1$ to $Vsv\_10$ are grouped according to the read success numbers of the solving voltages $Vsv\_1$ to $Vsv\_10$, when the read success number of any one of the solving voltages $Vsv\_1$ to $Vsv\_10$ is changed, the groups G1 and G2 may be updated in descending order of the read success numbers. For instance, the solving voltages $Vsv\_1$ to $Vsv\_10$ may be swapped between the groups G1 and G2 in such a manner that the read fail solving voltages, the read success numbers of which belong to an upper half of the read success numbers of the solving voltages $Vsv\_1$ to $Vv\_10$ in descending order, may be included in the first: group G1, and the read fail solving voltages, the read success numbers of which belong to a lower half of the read success numbers of the solving voltages $Vsv\_1$ to $Vsv\_10$ in descending order may be included in the second group G2. As shown in FIG. 5, when the read success number of the solving voltage $Vsv\_5$ included in the second group G2 is changed from 26 to 28, the solving voltage $Vsv\_5$ may be changed to belong to the first group G1 instead of the second group G2, and the solving voltage $Vsv\_2$, the read success number of which is 27, may be changed to belong to the second group G2 instead of the first group G1.

Referring to FIG. 6, the read fail solving voltage table, which is referred to in the case of a 2-bit multi-level cell (MLC), may have a plurality of solving voltage sets S1 to S10 which are grouped into two or more groups G1 and G2. Each of the solving voltage sets S1 to S10 may include solving voltages for reading respective threshold voltage distributions of the memory cells. In other words, each of the solving voltage sets S1 to S10 may include the solving voltage for reading LSB data and the solving voltages for reading MSB data. When taking an example according to the threshold voltage distributions described above with reference to FIG. 3, the solving voltage set S1 may include the solving voltage $Vsv\_P2\_8$ corresponding to the LSB read voltage $Vrd\_P2$ and solving voltages $Vsv\_P1\_7$ and $Vsv\_P3\_7$ corresponding to the MSB read voltages $Vrd\_P1$ and $Vrd\_P3$.

Each of the solving voltages $Vsv\_P2\_1$ to $Vsv\_P2\_10$ for reading LSB data may be included in a first group G1 or a second group G2 according to its read success numbers. Also, each pair of solving voltages $Vsv\_P1\_1$ to $Vsv\_P1\_10$ and $Vsv\_P3\_1$ to $Vsv\_P3\_10$ for reading MSB data may be included in the first group G1 or the second group G2 according to its read success numbers. The first group G1 may include the solving voltages, the read success numbers which are relatively large, and the second group G2 may include the solving voltages, the read success numbers of which are relatively small.

As described above with reference to FIG. 5, when the read success number corresponding to a solving voltage is changed, the solving voltages included in the groups may be updated according in descending order of the read success numbers. For instance, the solving voltages for the LSB read and the MSB read may be swapped between the groups G1 and G2 in such a manner that the read fail solving voltages, the read success numbers of which belong to an upper half of the read success numbers of the solving voltages $Vsv\_P2\_1$ to $Vsv\_P2\_10$ for reading LSB data and the pairs of solving voltages $Vsv\_P1\_1$ to $Vsv\_P1\_10$ and $Vsv\_P3\_1$ to $Vsv\_P3\_10$ for reading MSB data in descending order may be included in the first group G1, and the read fail solving voltages, the read success numbers of which belong to a lower half of the read success numbers of the solving voltages $Vsv\_P2\_1$ to $Vsv\_P2\_10$ for reading LSB data and the pairs of solving voltages $Vsv\_1\_1$ to $Vsv\_P1\_10$ and $Vsv\_P3\_1$ to $Vsv\_P3\_10$ for reading MSB data in descending order may be included in the second group G2.

When the static read fail solving operation is performed, one of the solving voltages or the solving voltage sets included in the read fail solving voltage tables may be selected. To increase the success rate of read operations, the read operation may be performed sequentially with the solving voltages or the solving voltage sets in descending order of the read success numbers from the largest to smallest whenever the ECC fails. If a read fail occurs as a result of performing the read operation with the solving voltages or the solving voltage sets of the first group G1, the read operation may be performed again with the solving voltages or the solving voltage sets of the second group G2 to which smaller read success numbers belong. The static read fail solving operation based on the priority of the first group G1 and the second group G2 will be described later in detail with reference to a flow chart.

Figure 7:
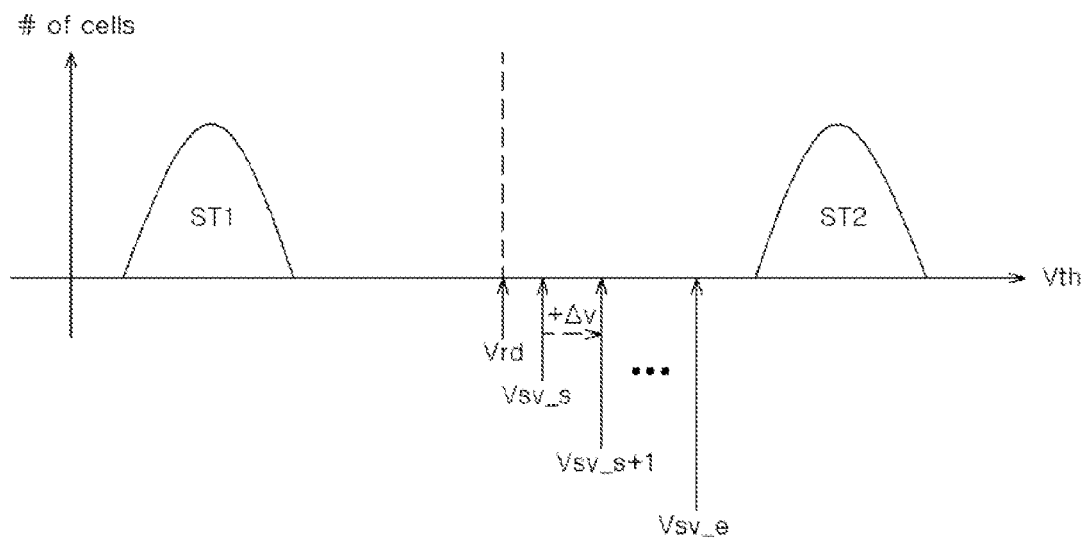
FIGS. 7 and 8 are diagrams illustrating an operating method of a data storage device in accordance with an embodiment.
Figure 8:
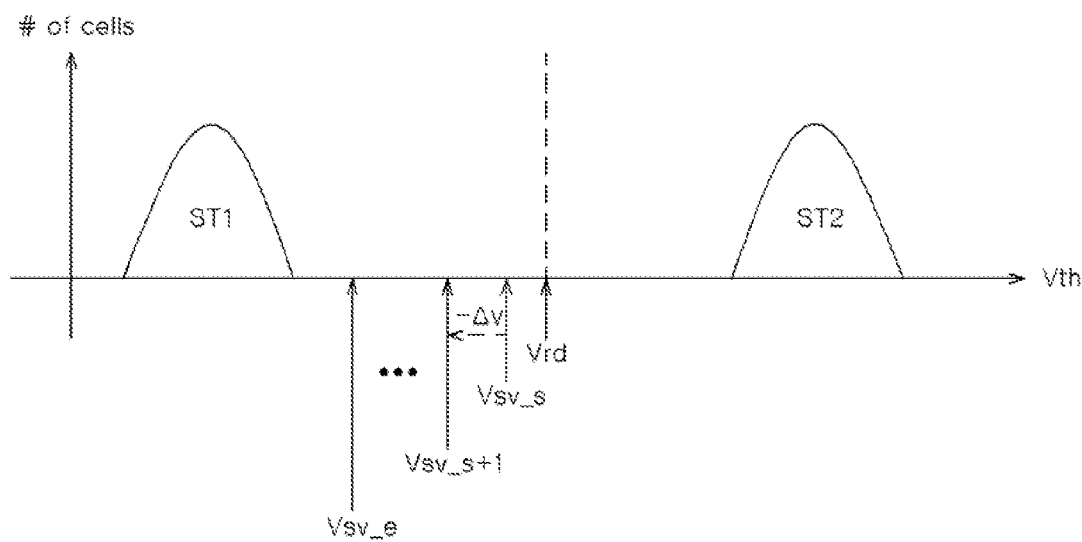

FIGS. 7 and 8 are diagrams illustrating an operating method of a data storage device in accordance with an embodiment. Where the dynamic read fail solving operation is performed, a solving voltage may be dynamically selected within a solving voltage range. In other words, a solving voltage may be selected by increasing or decreasing a voltage level within the range between a start solving voltage $Vsv\_s$ and an end solving voltage $Vsv\_e$.

When taking an example with reference to FIG. 7, an initial read operation which is performed during the dynamic read fail solving operation may be performed using the start solving voltage $Vsv\_s$, and the next read operation may be performed using a solving voltage $Vsv\_s+1$ which is increased compared to the start solving voltage $Vsv\_s$. If the read operation is continuously repeated, solving voltages, the voltage level of each of which is increased by an increment $+\Delta V$ each time the read operation is repeated, may be used. The increment $+\Delta V$ of the solving voltage may be constant or variable.

When taking an example with reference to FIG. 8, an initial read operation which is performed during the dynamic read fail solving operation may be performed using the start solving voltage Vsv_s, and the next read operation may be performed using a solving voltage Vsv_s+1 which is decreased compared to the start solving voltage Vsv_s. If the read operation is continuously repeated, solving voltages, which is decreased by a decrement −ΔV each time the read operation is repeated, may be used. The decrement −ΔV of the solving voltage may be constant or variable.

Figure 9:
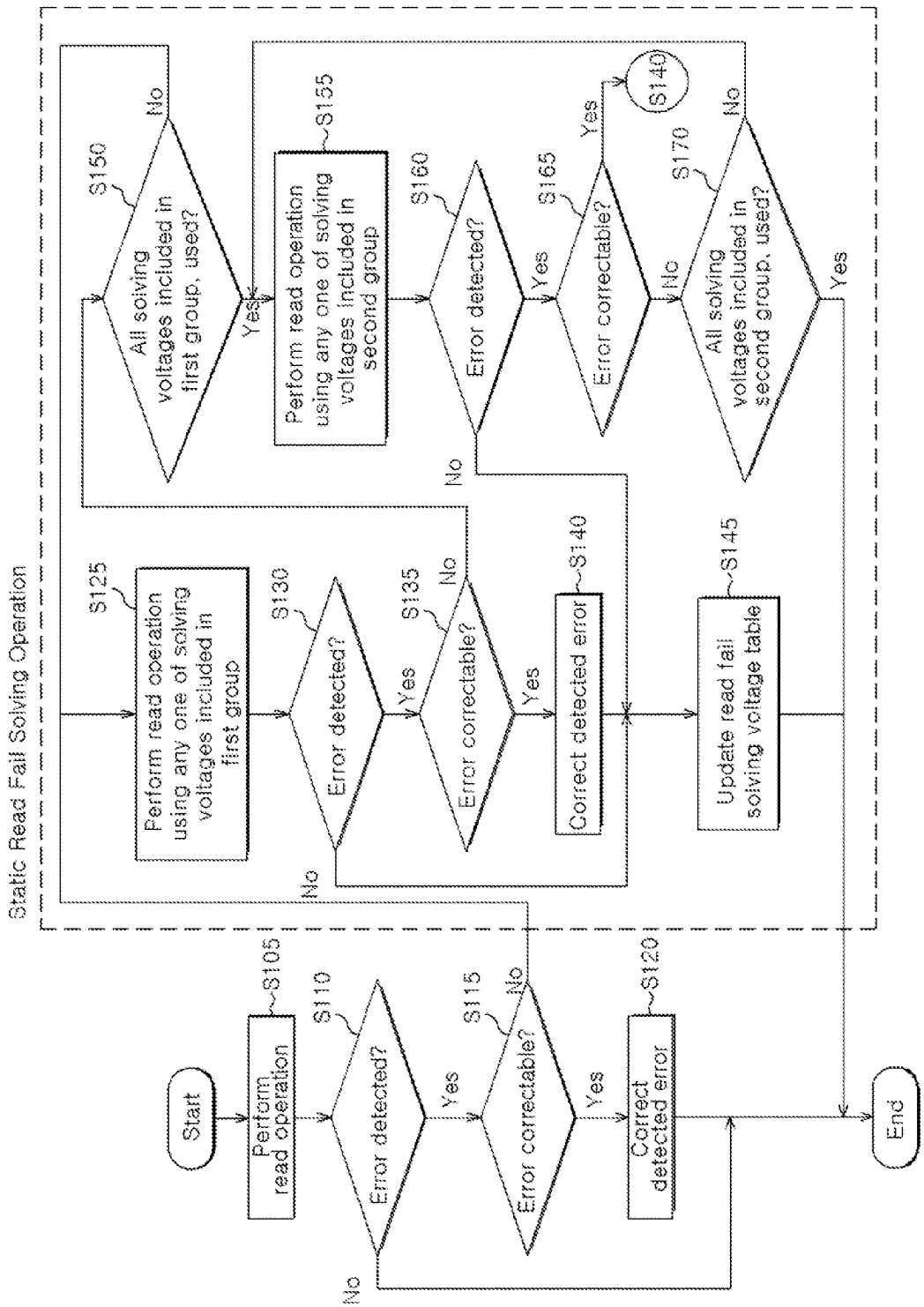
FIG. 9 is a flow chart illustrating an operating method of a data storage device in accordance with an embodiment.

FIG. 9 is a flow chart illustrating an operating method of a data storage device in accordance with an embodiment.

In step S105, the control unit 121 may perform a read operation for the nonvolatile memory device 110 in response to a read request from the host device. Namely, the control unit 121 may perform a read operation for a memory cell of the nonvolatile memory device 110 corresponding to an address which is read-requested from the host device.

In step S110, the ECC unit 125 may determine whether an error is included in the read data Where an error is not included in the read data, the read operation may be successfully ended. Where an error is included in read data, the process may proceed to step S115.

In the step S115, the ECC unit 125 may determine whether the detected error is correctable. When the detected error is correctable, the process may proceed to step S120. In the step S120, the ECC unit 125 may correct the error included in the read data. Then, the read operation may be successfully ended. When the detected error is not correctable, the read fail solving block 122 may perform the static read fail solving operation including steps S125 to S170.

In the step S125, the read fail solving block 122 may perform the read operation using a selected one of the solving voltages included in the first group G1 of the read fail solving voltage table. The read fail solving block 122 may provide the selected solving voltage to the nonvolatile memory device 110, and may control the nonvolatile memory device 110 in such a manner that the read operation is performed as the provided solving voltage is applied to a read-requested memory cell.

In the step S130, the ECC unit 125 may determine whether an error is included in read data. When an error is not included in read data, that is, when the read operation of the read fail solving operation has succeeded, the process may proceed to the step S145. When an error is included in read data, the process may proceed to the step S135.

In the step S145, the read fail solving block 122 may update the read fail solving voltage table. For instance, the read fail solving block 122 may increase the read success number of the read fail solving voltage table, corresponding to the solving voltage used at the step S125, by 1. If necessary, the read fail solving block 122 may update the first group G1 and the second group G2 of the read fail solving voltage table as the result of change in the read success number. After the step S145, the read operation may be successfully ended.

In the step S135, the ECC unit 125 may determine whether the detected error is correctable. When the detected error is correctable, the process may proceed to the step S140. In the step S140, the ECC unit 125 may correct the error included in the read data. After the step S140, the read fail solving voltage table may be updated through the step S145, and then, the read operation may be successfully ended as described above.

When the detected error is not correctable, the process may proceed to the step S150. In the step S150, the read fail solving block 122 may determine whether the solving voltages included in the first group G1 are all referred to. When the solving voltages included in the first group G1 are not all referred to, the process may proceed to the step S125. That is to say, if it is determined that the error of the data read by the previous read operation is not correctable, the read fail solving block 122 may perform the read operation again using another solving voltage included in the first group G1.

When the solving voltages included in the first group are all referred to, the process may proceed to the step S155. In the step S155, the read fail solving block 122 may perform the read operation using a selected one of the solving voltages included in the second group G2 of the read fail solving voltage table. The read fail solving block 122 may provide the selected solving voltage to the nonvolatile memory device 110, and may control the nonvolatile memory device 110 in such a manner that the read operation is performed as the provided solving voltage is applied to the read-requested memory cell.

In the step S160, the ECC unit 125 may determine whether an error is included in read data. When an error is not included in read data, that is, when the read operation of the read fail solving operation has succeeded, the process may proceed to the step S145. The read fail solving voltage table may be updated through the step S145, and then, the read operation may be successfully ended as described above. When an error is included in read data, the process may proceed to the step S165.

In the step S165, the ECC unit 125 may determine whether the detected error is correctable. When the detected error is correctable, the process may proceed to the step S140. The error included in the read data may be corrected through the step S140. Then, the read fail solving voltage table may be updated through the step S145, and the read operation may be successfully ended as described above.

When the detected error is not correctable, the process may proceed to the step S170. In the step S170, the read fail solving block 122 may determine whether the solving voltages included in the second group G2 are all referred to. When the solving voltages included in the second group are not all referred to, the process may proceed to the step S155. That is to say, if it is determined that the error of the data read by the previous read operation is not correctable, the read fail solving block 122 may perform the read operation again using another solving voltage included in the second group G2.

When the solving voltages included in the second group are all referred to, because both the read operation performed in the step S105 and the static read fail solving operation have failed, the read operation is abnormally ended. In this case, the control unit 121 may notify a read fail to the host device.

According to the static read fail solving operation, a primary static read fail solving operation performed through the steps S125 to S150 which uses the solving voltages included in the first group G1 may be first performed, and then, a secondary static read fail solving operation performed through the steps S140, S145 and S155 to S170 which uses the solving voltages included in the second group G2 may be performed. Because solving voltages which have larger read success numbers are included in the first group G1 and solving voltages which have smaller read success numbers are included in the second group G2, a read success rate may be increased by first using the solving voltages included in the first group G1.

Figure 10:
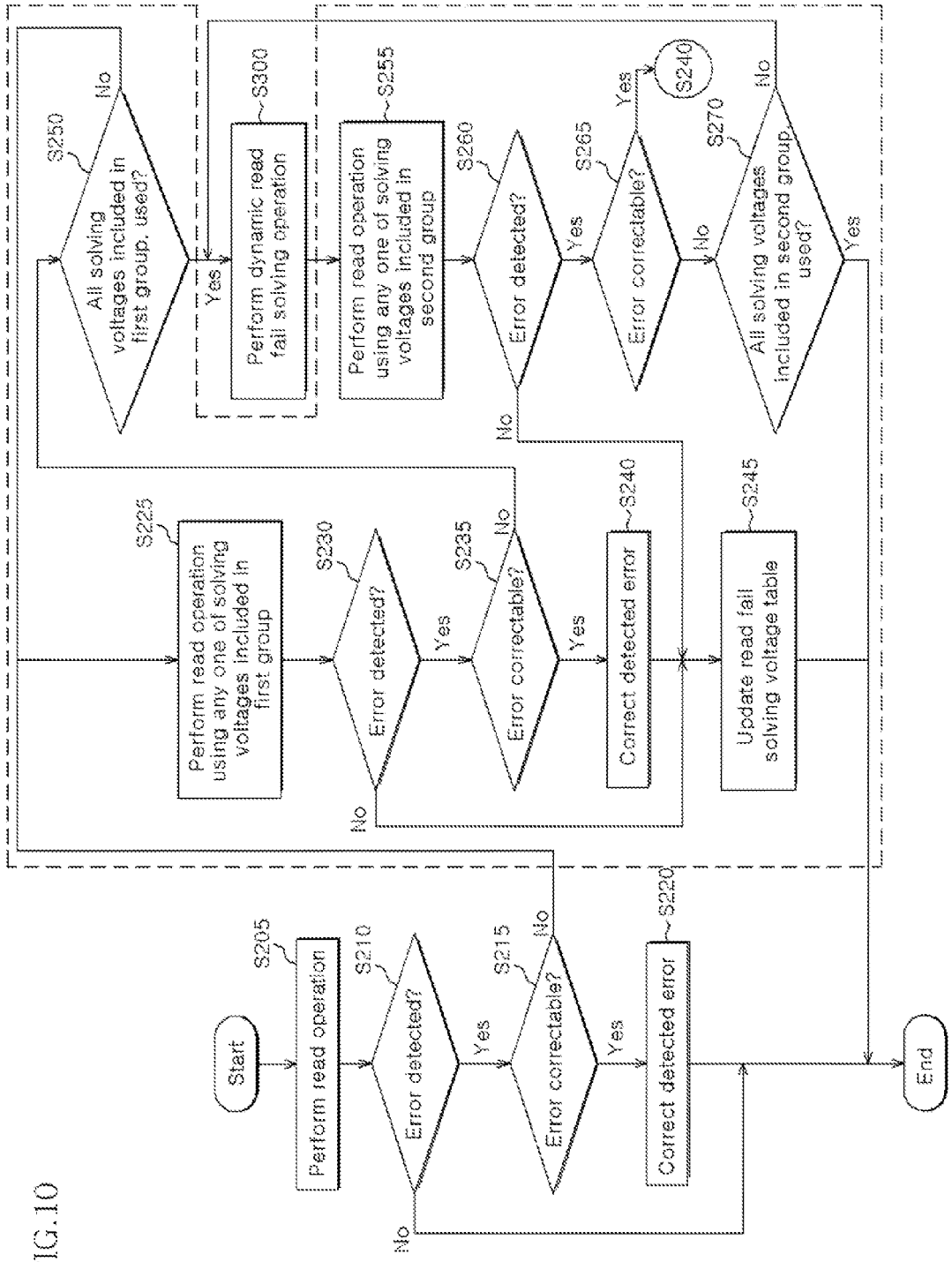
FIGS. 10 and 11 are flow charts illustrating an operating method of a data storage device in accordance with an embodiment.
Figure 11:
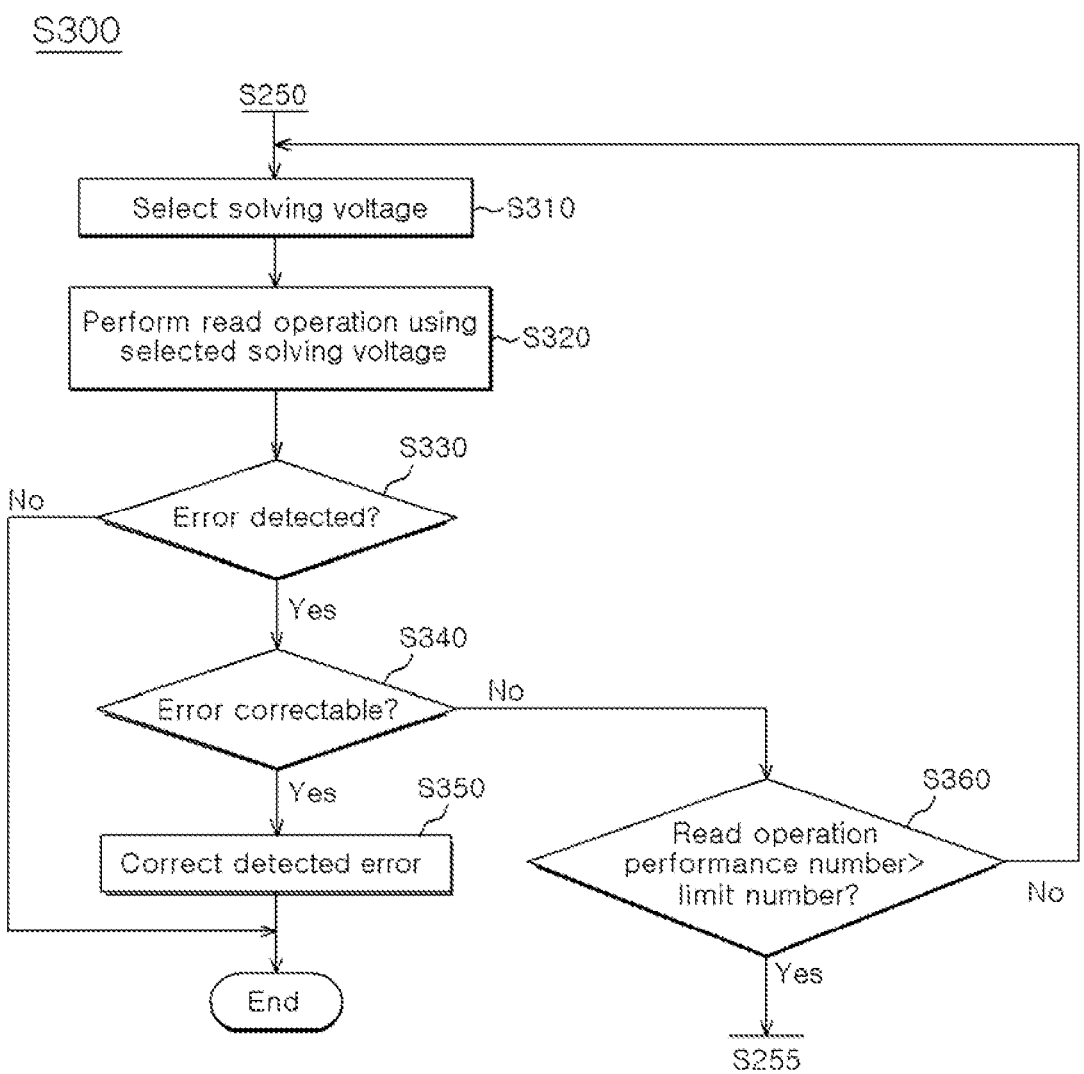

FIGS. 10 and 11 are flow charts illustrating an operating method of a data storage device in accordance with an embodiment.

In step S205, the control unit 121 may perform a read operation for the nonvolatile memory device 110 in response to a read request from the host device. Namely, the control unit 121 may perform a read operation for a memory cell of the nonvolatile memory device 110 corresponding to an address which is read-requested from the host device.

In step S210, the ECC unit 125 may determine whether an error is included in the read data. When an error is not included in the read data, the read operation may be successfully ended. When an error is included in read data, the process may proceed to step S215.

In the step S215, the ECC unit 125 may determine whether the detected error is correctable. When the detected error is correctable, the process may proceed to step S220. In the step S220, the ECC unit 125 may correct the error included in the read data. Then, the read operation may be successfully ended. When it is determined that the detected error is not correctable, the read fail solving block 122 may perform the static read fail solving operation including steps S225 to S270 and the dynamic read fail solving operation including step S300 shown in FIG. 10 and steps S310 to S360 shown in FIG. 11.

In the step S225, the read fail solving block 122 may perform the read operation using a selected one of the solving voltages included in the first group G1 of the read fail solving voltage table. The read fail solving block 122 may provide the selected solving voltage to the nonvolatile memory device 110, and may control the nonvolatile memory device 110 in such a manner that the read operation is performed as the provided solving voltage is applied to a read-requested memory cell.

In the step S230, the ECC unit 125 may determine whether an error is included in read data. When an error is not included in read data, that is, when the read operation of the static read fail solving operation has succeeded, the process may proceed to the step S245. When an error is included in read data, the process may proceed to the step S235.

In the step S245, the read fail solving block 122 may update the read fail solving voltage table. For instance, the read fail solving block 122 may increase the read success number of the read fail solving voltage table corresponding to the solving voltage used in the step S225 by 1. If necessary, the read fail solving block 122 may update the first group G1 and the second group G2 of the read fail solving voltage table as the result of change in the read success number. After the step S245, the read operation may be successfully ended.

In the step S235, the ECC unit 125 may determine whether the detected error is correctable. When the detected error is correctable, the process may proceed to the step S240. In the step S240, the ECC unit 125 may correct the error included in the read data. After the step S240, the read fail solving voltage table may be updated through the step S245, and then, the read operation may be successfully ended as described above.

When the detected error is not correctable, the process may proceed to the step S250. In the step S250, the read fail solving block 122 may determine whether the solving voltages included in the first group G1 are all referred to. When the solving voltages included in the first group are not all referred to, the process may proceed to the step S225. That is to say, if it is determined that the error of the data read by the previous read operation is not correctable, the read fail solving block 122 may perform the read operation again using another solving voltage included in the first group G1.

When the solving voltages included in the first group are all referred to, the process may proceed to step S300. In the step S300, the read fail solving block 122 may perform the dynamic read fail solving operation. The dynamic read fail solving operation will be described below in detail with reference to FIG. 11.

In the step S310, as described above with reference to FIGS. 7 and 8, the read fail solving block 122 may select a solving voltage for the dynamic read fail solving operation by increasing or decreasing a voltage within the solving voltage range.

In the step S320 the read fail solving block 122 may perform the read operation of the dynamic read fail solving operation using the selected solving voltage. The read fail solving block 122 may provide the selected solving voltage to the nonvolatile memory device 110, and may control the nonvolatile memory device 110 in such a manner that the read operation of the dynamic read fail solving operation is performed as the provided solving voltage is applied to the read-requested memory cell.

In the step S330, the ECC unit 125 may determine whether an error is included in read data. When an error is not included in read data, the read operation of the dynamic read fail solving operation may be successfully ended. In other words, when the dynamic read fail solving operation has succeeded, the process of FIG. 10 may be ended. When an error is included in read data, the process may proceed to the step S340.

In the step S340, the ECC unit 125 may determine whether the detected error is correctable. When the detected error is correctable, the process may proceed to the step S350. In the step S350, the ECC unit 125 may correct the error included in the read data. Then, the read operation of the dynamic read fail solving operation may be successfully ended. In other words, when the dynamic read fail solving operation has succeeded, the process of FIG. 10 may be ended.

When the detected error is not correctable, the process may proceed to the step S360. In the step S360, the read fail solving block 122 may determine whether the number of times the read operation of the dynamic read fail solving operation is performed exceeds a predetermined limit number. When the number of times the read operation of the dynamic read fail solving operation is performed does not exceed the limit number, the process may proceed to the step S310. Namely, the read fail solving block 122 may set again a solving voltage for the dynamic read fail solving operation and may perform the read operation again.

When the number of times by which the read operation of the dynamic read fail solving operation is performed exceeds the limit number, because the dynamic read fail solving operation has failed, the process may proceed to the step S255.

Referring back to FIG. 10, in the step S255, the read fail solving block 122 may perform the read operation using a selected one of the solving voltages included in the second group G2 of the read fail solving voltage table. The read fail solving block 122 may provide the selected solving voltage to the nonvolatile memory device 110, and may control the nonvolatile memory device 110 in such a manner that the read operation is performed as the provided solving voltage is applied to the read-requested memory cell.

In the step S260, the ECC unit 125 may determine whether an error is included in read data. When an error is not included in read data, that is, when the read operation of the static read fail solving operation has succeeded, the process may proceed to the step S245. The read fail solving voltage table may be updated through the step S245, and then, the read operation may be successfully ended as described above. When an error is included in read data, the process may proceed to the step S265.

In the step S265, the ECC unit 125 may determine whether the detected error is correctable. When the detected error is correctable, the process may proceed to the step S240. The error included in the read data may be corrected through the step S240. Then, the read fail solving voltage table may be updated through the step S245, and the read operation may be successfully ended as described above.

When the detected error is not correctable, the process may proceed to the step S270. In the step S270, the read fail solving block 122 may determine whether the solving voltages included in the second group G2 are all referred to. When the solving voltages included in the second group G2 are not all referred to, the process may proceed to the step S255. That is to say, if it is determined that the error of the data read by the previous read operation is not correctable, the read fail solving block 122 may perform the read operation again using another solving voltage included in the second group G2.

When the solving voltages included in the second group are all referred to, because all of the read operation performed in the step S205, the static read fail solving operation and the dynamic read fail solving operation have failed, the read operation is abnormally ended. In this case, the control unit 121 may notify a read fail to the host device.

It is illustrated in the flow chart shown in FIG. 10 that the dynamic read fail solving operation of the step S300 described above with reference to FIGS. 10 and 11 is performed when the primary static read fail solving operation of the step S225 using the solving voltages included in the first group GI has failed, and that the secondary static read fail solving operation of the step S255 using the solving voltages included in the second group G2 is performed when the dynamic read fail solving operation of the step S300 has failed.

Although not shown, the dynamic read fail solving operation may be performed before the primary static read fail solving operation. In this case, the primary static read fail solving operation may be performed when the dynamic read fail solving operation has failed, and the secondary static read fail solving operation may be performed when the primary static read fail solving operation has failed. For another example, the dynamic read fail solving operation may be performed when the secondary static read fail solving operation has failed. In this case, the secondary static read fail solving operation may be performed when the primary static read fail solving operation has failed, and the dynamic read fail solving operation may be performed when the secondary static read fail solving operation has failed.

Figure 12:
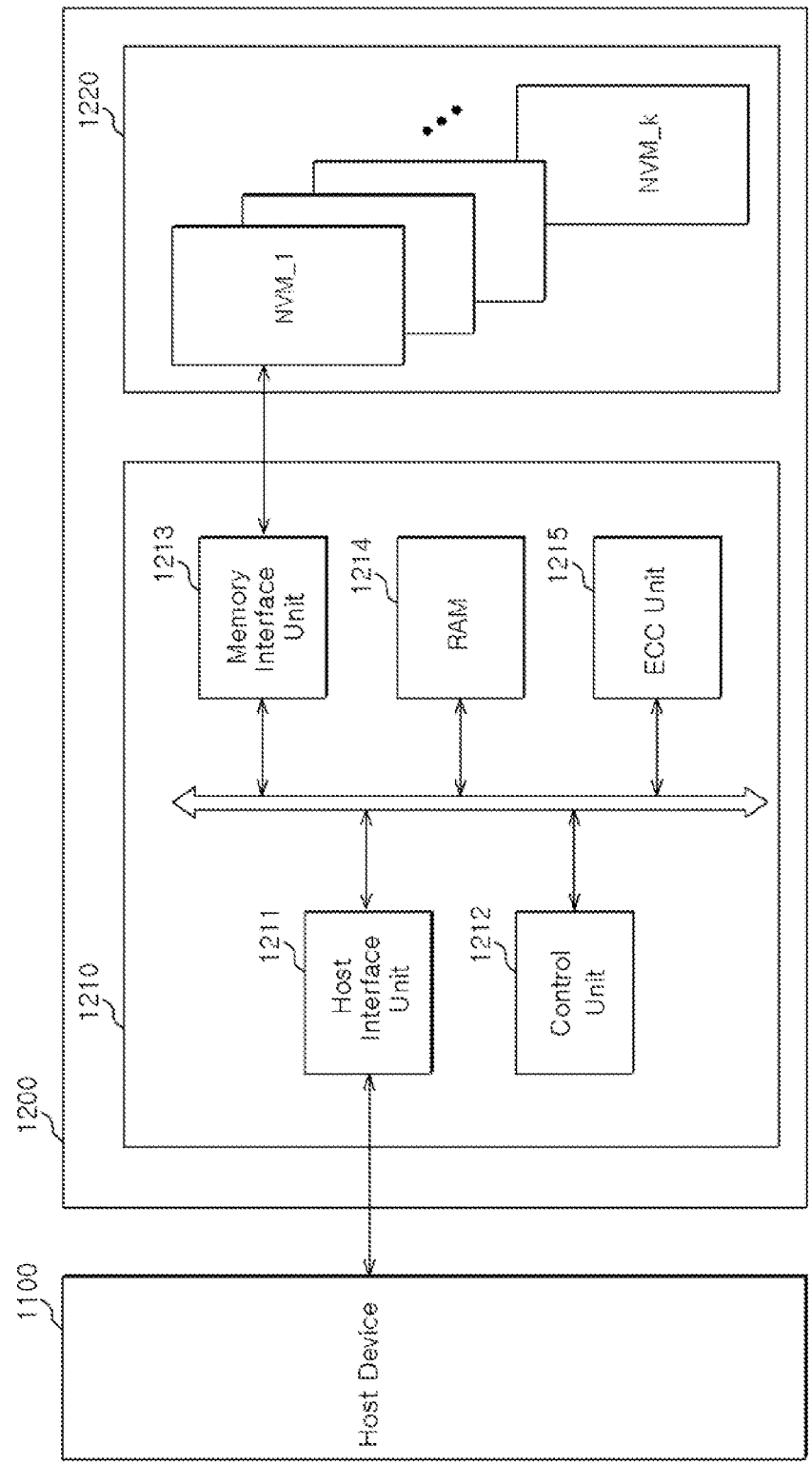
FIG. 12 is a block diagram illustrating a data processing system including a data storage device in accordance an embodiment.

FIG. 12 is a block diagram illustrating a data processing system including a data storage device in accordance an embodiment. Referring to FIG. 12, a data processing system 1000 may include a host device 1100 and a data storage device 1200.

The data storage device 1200 may include a controller 1210, and a nonvolatile memory device 1220. The data storage device 1200 may be electrically coupled to the host device 1100 such as a mobile phone, an MP3 player, a laptop computer, a desktop computer, a game player, a TV, an in-vehicle infotainment system, and so forth. The data storage device 1200 is also referred to as a memory system.

The controller 1210 may access the nonvolatile memory device 1220 in response to a request from the host device 1100. For example, the controller 1210 may control the read, program or erase operations of the nonvolatile memory device 1220. The controller 1210 may drive firmware for controlling the nonvolatile memory device 1220.

The controller 1210 may include a host interface unit 1211, a control unit 1212, a memory interface unit 1213, a RAM 1214, and an error correction code (ECC) unit 1215.

The control unit 1212 may control the general operations of the controller 1210 in response to a request from the host device 1100. Although not shown, the control unit 1212 may include the read fail solving block 122 shown in FIG. 1 or may perform the function of the read fail solving block 122.

The RAM 1214 may be used as the working memory of the control unit 1212. The RAM 1214 may be used as a buffer memory which temporarily stores the data read from the nonvolatile memory device 1220 or the data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code unit 1215 may detect an error of the data read from the nonvolatile memory device 1220. Also, the error correction code unit 1215 may correct the detected error when the detected error is within a correctable range.

The nonvolatile memory device 1220 may be used as the storage medium of the data storage device 1200. The nonvolatile memory device 1220 may include a plurality of nonvolatile memory chips (or dies) NVM_1 to NVM_k.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a personal computer memory card international association (PCMCIA) card, a compact flash (CF) card, a smart media card, a memory stick, and so forth.

Figure 13:
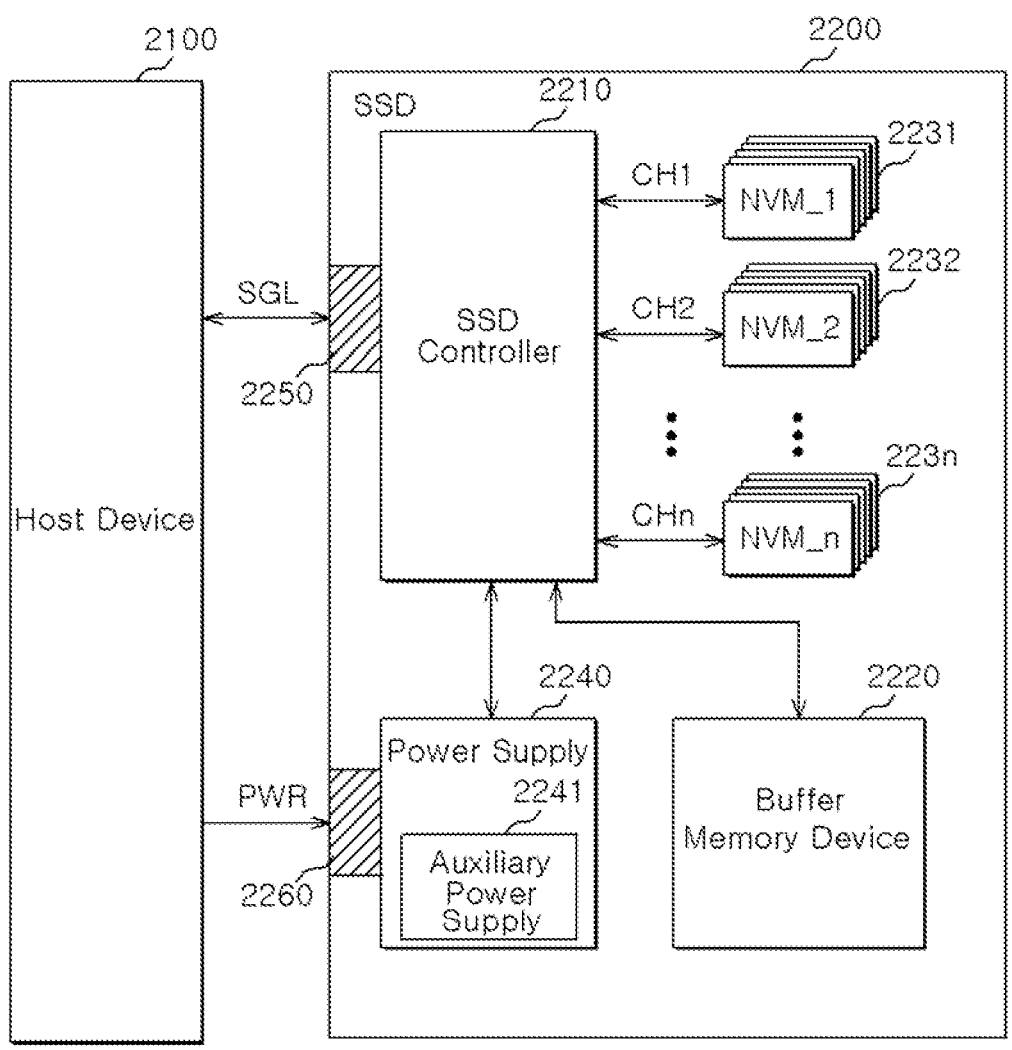
FIG. 13 is a block diagram illustrating a data processing system including a solid state drive (SSD) in accordance with an embodiment.

FIG. 13 is a block diagram illustrating a data processing system including a solid state drive (SSD) in accordance with an embodiment. Referring to FIG. 13, a data processing system 2000 may include a host device 2100 and a solid state drive (SSD) 2200.

The SSD 2200 may include an SSD controller 2210, the buffer memory device 2220, nonvolatile memory devices 2231 to 223n, a power supply 2240, a signal connector 2250, and a power connector 2260.

The SSD 2200 may operate in response to a request from the host device 2100. That is to say, the SSD controller 2210 may access the nonvolatile memory devices 2231 to 223n in response to a request from the host device 2100. For example, the SSD controller 2210 may control the read, program and erase operations of the nonvolatile memory devices 2231 to 223n.

The buffer memory device 2220 may temporarily store data which are to be stored in the nonvolatile memory devices 2231 to 223n. Further, the buffer memory device 2220 may temporarily store data which are read from the nonvolatile memory devices 2231 to 223n. The data temporarily stored in the buffer memory device 2220 may be transmitted to the host device 2100 or the nonvolatile memory devices 2231 to 223n under the control of the SSD controller 2210.

The nonvolatile memory devices 2231 to 223n may be used as storage media of the SSD 2200. The nonvolatile memory devices 2231 to 223n may be electrically coupled to the SSD controller 2210 through a plurality of channels CH1 to CHn, respectively. One or more nonvolatile memory devices may be electrically coupled to one channel. The nonvolatile memory devices electrically coupled to one channel may be electrically coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power to allow the SSD 2200 to be normally terminated when a sudden power-off occurs. The auxiliary power supply 2241 may include super capacitors capable of being charged with power PWR.

The SSD controller 2210 may exchange a signal SGL with the host device 2100 through the signal connector 2250. The signal SGL may include a command, an address, data and so forth. The signal connector 2250 may be configured by a connector such as a parallel advanced technology attachment (PATH), serial advanced technology attachment (SATA), small computer system interface (SCSI), serial attached SCSI (SAS), peripheral component interconnection (PCI) and PCI express (PCI-E) protocols, according to the interface scheme between the host device 2100 and the SSD 2200.

Figure 14:
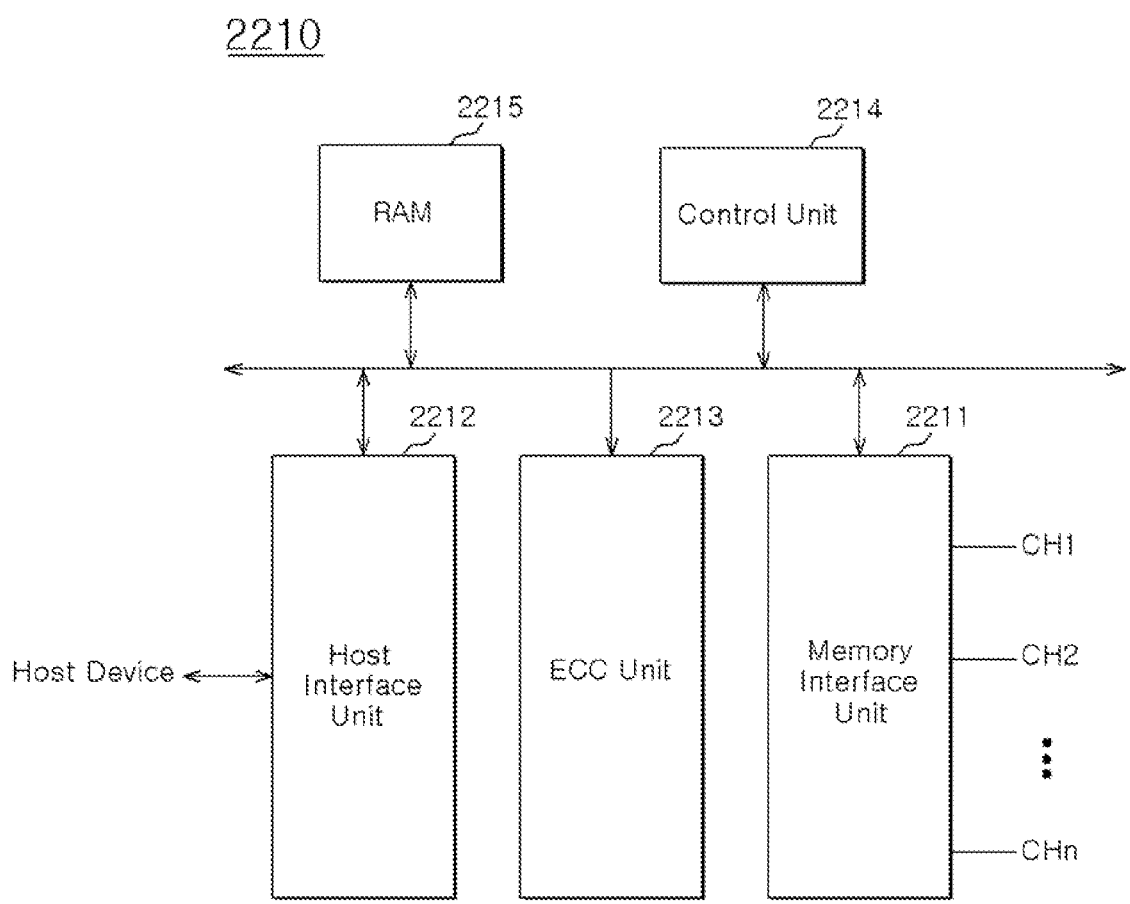
FIG. 14 is a block diagram illustrating a SSD controller shown in FIG. 13.

FIG. 14 is a block diagram illustrating the SSD controller shown in FIG. 13. Referring to FIG. 14, the SSD controller 2210 may include a memory interface unit 2211, a host interface unit 2212, an error correction code (ECC) unit 2213, a control unit 2214, and a RAM 2215.

The memory interface unit 2211 may provide a control signal such as a command and an address to the nonvolatile memory devices 2231 to 223n. Moreover, the memory interface unit 2211 may exchange data with the nonvolatile memory devices 2231 to 223n. The memory interface unit 2211 may scatter the data transmitted from the buffer memory device 2220 to the respective channels CH1 to CHn, under the control of the control unit 2214. Furthermore, the memory interface unit 2211 may transmit the data read from the nonvolatile memory devices 2231 to 223n to the buffer memory device 2220, under the control of the control unit 2214.

The host interface unit 2212 may provide an interface with the SSD 2200 corresponding to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The ECC unit 2213 may generate parity bits based on the data transmitted to the nonvolatile memory devices 2231 to 223n. The generated parity bits may be stored in spare areas of the nonvolatile memory devices 2231 to 223n. The ECC unit 2213 may detect an error of the data read from the nonvolatile memory devices 2231 to 223n, When the detected error is within a correctable range, the ECC unit 2213 may correct the detected error.

The control unit 2214 may analyze and process the signal SGL inputted from the host device 2100. The control unit 2214 may control the general operations of the SSD controller 2210 in response to a request from the host device 2100. The control unit 2214 may control the operations of the buffer memory device 2220 and the nonvolatile memory devices 2231 to 223n according to firmware for driving the SSD 2200. The RAM 2215 may be used as a working memory for driving the firmware.

Although not shown, the control unit 2214 may include the read fail solving block 122 shown in FIG. 1 or may perform the function of the read fail solving block 122.

Figure 15:
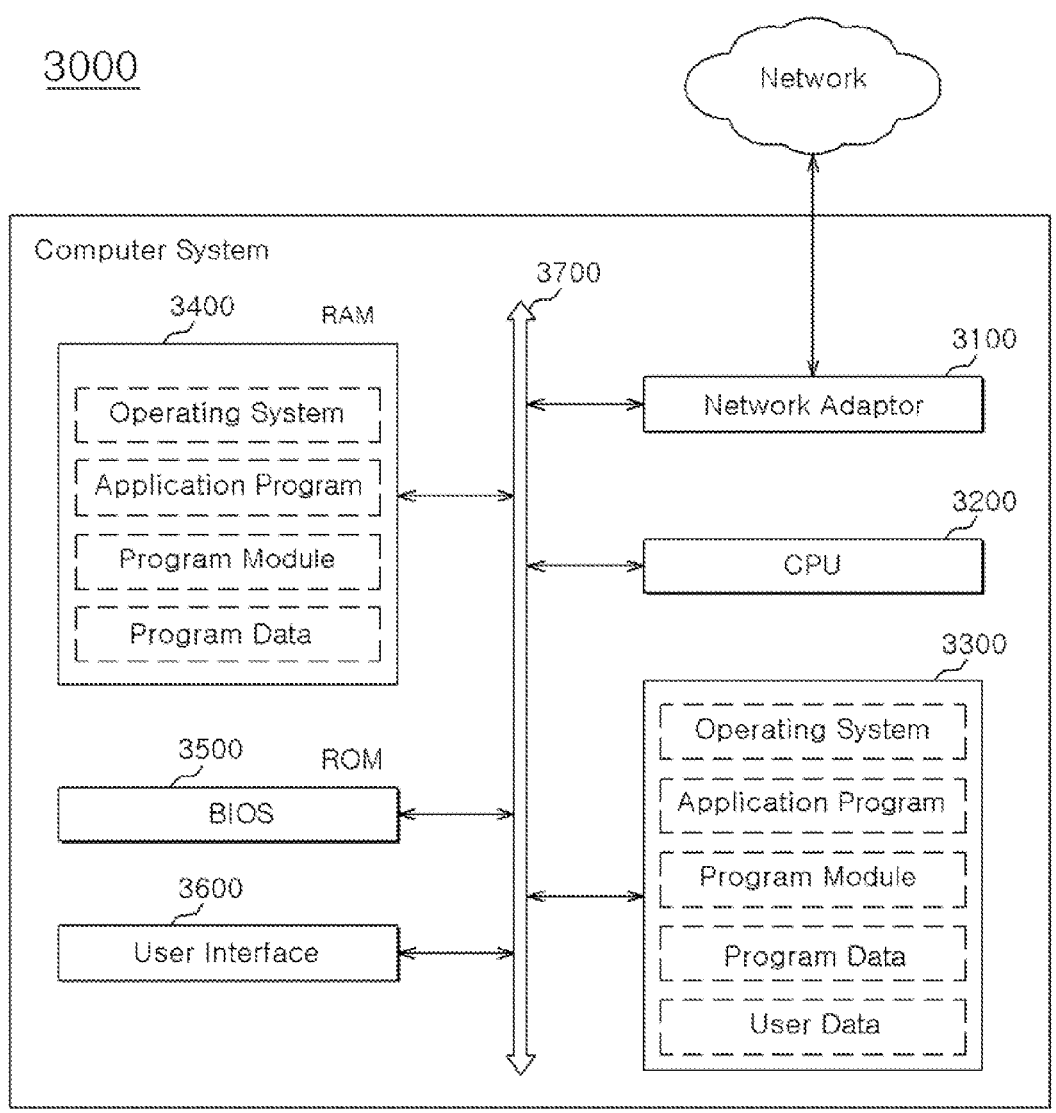
FIG. 15 is a block diagram illustrating a computer system in which a data storage device is mounted, in accordance with an embodiment.

FIG. 15 is a block diagram illustrating a computer system in which a data storage device is mounted, in accordance with an embodiment. Referring to FIG. 15, a computer system 3000 includes a network adaptor 3100, a central processing unit 3200, a data storage device 3300, a RAM 3400, a ROM 3500 and a user interface 3600, which are electrically coupled to a system bus 3700. The data storage device 3300 may be configured by the data storage device 100 shown in FIG. 1, the data storage device 1200 shown in FIG. 12 or the SSD 2200 shown in FIG. 13.

The network adaptor 3100 provides interfacing between the computer system 3000 and external networks. The central processing unit 3200 performs general operations for driving an operating system residing at the RAM 3400 or an application program.

The data storage device 3300 stores general data necessary in the computer system 3000. For example, an operating system for driving the computer system 3000, an application program, various program modules, program data and user data are stored in the data storage device 3300.

The RAM 3400 may be used as a working memory device of the computer system 3000. Upon booting, the operating system, the application program, the various program modules and the program data necessary for driving programs, which are read from the data storage device 3300, are loaded on the RAM 3400. A BIOS (basic input/output system) which is activated before the operating system is driven is stored in the ROM 3500. Information exchange between the computer system 3000 and a user is implemented through the user interface 3600.

While various embodiments have been described above, it will be understood to those skilled in the art that the embodiments described are examples only. Accordingly, the described embodiments should not limit the claims but, instead, aid in understanding the claims.

What is claimed is:

1. An operating method of a data storage device, comprising:

grouping read fail solving voltages into a first group and a second group depending on its read success numbers:

performing a first static read fail solving operation in which a memory cell is read by applying read fail solving voltages included in the first group to the memory cell; and performing a second static read fail solving operation in which the memory cell is read by applying read fail solving voltages included in the second group to the memory cell after the first static read fail solving operation fails, wherein read success numbers of the respective read fail solving voltages included in the first group are larger than read success numbers of the respective read fail solving voltages included in the second group.

2. The operating method of claim 1, further comprising maintaining the read fail solving voltages to remain arranged in descending order with respect to the read success numbers so that the read fail solving voltages of upper ranks are included in the first group, and the read fail solving voltages of lower ranks are included in the second group.

3. The operating method of claim 2, wherein the maintaining of the read fail solving voltages exchanges ranks of one or more of the read fail solving voltages included in each of the first and second groups according to the descending order when the read success numbers are changed.

4. The operating method of claim 1, further comprising:
performing a read operation by applying a read voltage to the memory cell which is read-requested from a host device before the performing of the first static read fail solving operation,
wherein each of the read fail solving voltages included in the first group and the read fail solving voltages included in the second group is different from the read voltage.

5. The operating method of claim 1, wherein the performing of the first static read fail solving operation reads the memory cell by sequentially applying the read fail solving voltages included in the first group to the memory cell until the read operation succeeds or all of the read fail solving voltages included in the first group are used.

6. The operating method of claim 1, wherein the performing of the second static read fail solving operation reads the memory cell by sequentially applying the read fail solving voltages included in the second group to the memory cell until the read operation succeeds or all of the read fail solving voltages included in the second group are used.

7. An operating method of a data storage device, comprising:
grouping read fail solving voltages into a first group and a second group depending on its read success numbers:
performing a first static read fail solving operation on a memory cell using read fail solving voltages included in the first group;
performing a dynamic read fail solving operation using read fail solving voltages dynamically selected within a solving voltage range after the first static read fail solving operation fails; and
performing a second read fail solving operation using read fail solving voltages included in the second group after the dynamic read fail solving operation fails,
wherein read success numbers of the respective read fail solving voltages included in the first group are larger than read success numbers of the respective read fail solving voltages included in the second group.

8. The operating method of claim 7, wherein the performing of the first static read fail solving operation reads the memory cell by sequentially using the read fail solving voltages included in the first group until the read operation succeeds or all of the read fail solving voltages included in the first group are used.

9. The operating method of claim 7, wherein the performing of the second static read fail solving operation reads the memory cell by sequentially using the read fail solving voltages included in the second group until the read operation succeeds or all of the read fail solving voltages included in the second group are used.

10. The operating method of claim 7, further comprising maintaining the read fail solving voltages to remain arranged in descending order with respect to the read success numbers so that the read fail solving voltages of upper ranks are included in the first group, and the read fail solving voltages of lower ranks are included in the second group.

11. The operating method of claim 7, wherein the performing of the dynamic read fail solving operation reads the memory cell by sequentially selecting one of a plurality of read fail solving voltages, which are different, within the solving voltage range until the read operation succeeds or the number of times the dynamic read fail solving operation is performed exceeds a predetermined limit number.

12. A data storage device comprising:
a nonvolatile memory device; and
a controller configured to grouping read fail solving voltages into a first group and a second group depending on its read success numbers, performing a first static read fail solving operation using read fail solving voltages included in the first group, and performing a second static read fail solving operation using read fail solving voltages included in the second group after the first static read fail solving operation fails,
wherein read success numbers of the respective read fail solving voltages included in the first group are larger than read success numbers of the respective read fail solving voltages included in the second group.

13. The data storage device of claim 12, wherein the controller reads a memory cell of the nonvolatile memory device by sequentially applying the read fail solving voltages included in the first group to the memory cell until the read operation succeeds or all of the read fail solving voltages included in the first group are used during the first static read fail solving operation.

14. The data storage device of claim 13, wherein the controller reads the memory cell by sequentially applying the read fail solving voltages included in the first group to the memory cell until the read operation succeeds or all of the read fail solving voltages included in the first group are used.

15. The data storage device of claim 12, wherein the controller reads a memory cell of the nonvolatile memory device by sequentially applying the read fail solving voltages included in the second group to the memory cell until the read operation succeeds or all of the read fail solving voltages included in the second group are used during the second static read fail solving operation.

16. The data storage device of claim 15, wherein the controller reads the memory cell by sequentially applying the read fail solving voltages included in the second group to the memory cell until the read operation succeeds or all of the read fail solving voltages included in the second group are used.

17. The data storage device of claim 12, wherein the controller further maintains the read fail solving voltages to remain arranged in descending order with respect to the read success numbers so that the read fail solving voltages of upper ranks are included in the first group, and the read fail solving voltages of lower ranks are included in the second group.

18. The data storage device of claim 17, wherein the controller exchanges ranks of one or more of the read fail solving voltages included in each of the first and second groups in descending order when the read success numbers are changed.

19. The data storage device of claim 12, wherein the controller further performs a dynamic read fail solving operation using read fail solving voltages dynamically selected within a solving voltage range.

20. The data storage device of claim 19. wherein the controller reads a memory cell of the nonvolatile memory device by sequentially selecting one of a plurality of read fail solving voltages, which are different from one another, within the solving voltage range until the read operation succeeds or the number of times the dynamic read fail solving operation is performed exceeds a predetermined limit number.

* * * * *